US012635116B2

(12) United States Patent (10) Patent No.: US 12,635,116 B2
Azuma (45) Date of Patent: May 19, 2026

(54) POWER CONVERSION DEVICE

(71) Applicant: FUJI ELECTRIC CO., LTD.,
Kawasaki (JP)

(72) Inventor: Toshiaki Azuma, Amagasaki (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 418 days.

(21) Appl. No.: 18/297,776

(22) Filed: Apr. 10, 2023

(65) Prior Publication Data

US 2023/0345680 A1 Oct. 26, 2023

(30) Foreign Application Priority Data

Apr. 25, 2022 (JP) .................................. 2022-071939

(51) Int. Cl.
H05K 7/20 (2006.01)
H02K 5/22 (2006.01)
H02M 7/00 (2006.01)

(52) U.S. Cl.
CPC ........... H05K 7/20927 (2013.01); H02K 5/22
(2013.01); H02M 7/003 (2013.01)

(58) Field of Classification Search
None
See application file for complete search history.

(56) References Cited

U.S. PATENT DOCUMENTS

| | | | | | |
|---|---|---|---|---|---|
| 5,091,823 | A | * | 2/1992 | Kanbara | .............. H05K 9/0022 |
| | | | | | 361/736 |
| 6,909,607 | B2 | * | 6/2005 | Radosevich | .......... H02M 7/003 |
| | | | | | 361/689 |
| 7,358,442 | B2 | * | 4/2008 | Radosevich | .......... H02M 7/003 |
| | | | | | 174/68.2 |
| 2009/0206709 | A1 | | 8/2009 | Kakuda et al. | |
| 2014/0029319 | A1 | * | 1/2014 | Jochman | ............... H01L 23/367 |
| | | | | | 363/67 |
| 2016/0020680 | A1 | | 1/2016 | Hattori et al. | |
| 2016/0380586 | A1 | * | 12/2016 | Mostoller | ............... H02S 40/34 |
| | | | | | 174/520 |
| 2020/0274424 | A1 | | 8/2020 | Kunii et al. | |

(Continued)

FOREIGN PATENT DOCUMENTS

| | | |
|---|---|---|
| JP | 2009-201218 A | 9/2009 |
| JP | 2018042384 A | 3/2018 |
| JP | 2018-107949 A | 7/2018 |

(Continued)

OTHER PUBLICATIONS

Japan Patent Office, "Office Action for Japanese Patent Application
2022-071939," May 24, 2022.

(Continued)

*Primary Examiner* — Krystal Robinson
(74) *Attorney, Agent, or Firm* — HAUPTMAN HAM,
LLP

(57) ABSTRACT

A power conversion device includes a power converter and
a housing to be attached to a motor and to house the power
converter. The housing includes a power line introduction
hole through which a power line is introduced to supply
power from an outside to the power converter. The power
converter includes a connection terminal to which a terminal
of the power line introduced into the housing through the
power line introduction hole is directly connected.

12 Claims, 5 Drawing Sheets

(56)     References Cited

U.S. PATENT DOCUMENTS

| | | | |
|---|---|---|---|
| 2022/0263389 | A1 | 8/2022 | Kobayashi et al. |
| 2023/0015460 | A1 | 1/2023 | Goto et al. |

FOREIGN PATENT DOCUMENTS

| | | | | |
|---|---|---|---|---|
| JP | 2020061838 | A | 4/2020 | |
| JP | 2020-141443 | A | 9/2020 | |
| JP | 2021-044987 | A | 3/2021 | |
| WO | 2014/175010 | A1 | 10/2014 | |
| WO | 2020040278 | A1 | 2/2020 | |
| WO | WO-2020040279 | A1 * | 2/2020 | .............. H02M 7/48 |
| WO | 2021/002330 | A1 | 1/2021 | |
| WO | 2021117803 | A1 | 6/2021 | |

OTHER PUBLICATIONS

Japan Patent Office, Notice of Reasons for Refusal for Japanese Patent Application No. 2022-114732 mailed on Jan. 6, 2026; 17 pp.

* cited by examiner

POWER CONVERSION DEVICE

CROSS-REFERENCE TO RELATED APPLICATION

The present application claims priority of Japanese Patent Application No. 2022-071939 filed Apr. 25, 2022, the disclosure of which is hereby incorporated by reference.

BACKGROUND OF THE INVENTION

Field of the Invention

The present invention relates to a power conversion device, and more particularly, it relates to a power conversion device to which power is supplied from the outside via a power line.

Description of the Background Art

A power conversion device to which power is supplied from the outside via a power line is disclosed in general. Such a power conversion device is disclosed in Japanese Patent Laid-Open No. 2021-044987, for example.

A power conversion device described in Japanese Patent Laid-Open No. 2021-044987 includes a power converter that controls a rotating electrical machine (motor). The power converter is connected to a high-voltage battery via a power cable (power line). The power cable includes a cable-side connector. The power converter includes a converter-side connector. The cable-side connector is connected to the converter-side connector such that the power cable is connected to the power converter. The converter-side connector is provided on the outer peripheral surface of a housing that houses an inverter etc. of the power converter.

The power conversion device described in Japanese Patent Laid-Open No. 2021-044987 includes the converter-side connector on the outer peripheral surface of the housing of the power converter. Therefore, the size of the power conversion device is disadvantageously increased by the size of the converter-side connector (connector component).

SUMMARY OF THE INVENTION

The present invention has been proposed in order to solve the aforementioned problems, and an object of the present invention is to provide a power conversion device capable of reducing or preventing an increase in its size.

In order to attain the aforementioned object, a power conversion device according to an aspect of the present invention is to be attached to a motor, and includes a power converter and a housing to be attached to the motor and to house the power converter. The housing includes a power line introduction hole through which a power line is introduced to supply power from an outside to the power converter, and the power converter includes a connection terminal to which a terminal of the power line introduced into the housing through the power line introduction hole is directly connected.

In the power conversion device according to this aspect of the present invention, as described above, the housing includes the power line introduction hole through which the power line is introduced to supply power from the outside to the power converter, and the power converter includes the connection terminal to which the terminal of the power line introduced into the housing through the power line introduction hole is directly connected. Accordingly, the power line can be directly connected to the power converter via the connection terminal provided inside the housing without providing a connector to be connected to the power line on the outer peripheral surface of the housing. Consequently, it is not necessary to provide a connector, and thus an increase in the size of the power conversion device can be reduced or prevented.

In the power conversion device according to this aspect, the power line introduction hole preferably extends along a predetermined inclination direction inclined with respect to a direction perpendicular to an arrangement surface of the housing on which the power converter is arranged, and the connection terminal of the power converter preferably extends along the predetermined inclination direction inclined with respect to the direction perpendicular to the arrangement surface. Accordingly, the connection terminal extends in the same direction as the direction in which the power line introduction hole extends, and thus bending of the power line in the vicinity of the connection terminal can be reduced or prevented. Consequently, a break in the power line can be reduced or prevented. Moreover, it is not necessary to bend the power line inside the housing, and thus the power line can be easily connected to the connection terminal.

In this case, the housing preferably includes a side wall to surround the power converter, and a cover attachable to and detachable from the side wall to cover the side wall, and at least a portion of the connection terminal of the power converter extending along the predetermined inclination direction inclined with respect to the direction perpendicular to the arrangement surface of the housing preferably protrudes from an end of the side wall connected to the cover toward the cover. Accordingly, when the cover is detached from the side wall, at least a portion of the connection terminal protrudes toward the cover, and thus the connection terminal extending along the predetermined inclination direction can be easily screw-fastened, for example.

In the power conversion device in which at least a portion of the connection terminal protrudes from the end of the side wall connected to the cover toward the cover, the cover preferably has a concave shape that is recessed toward a side opposite to the side wall. Accordingly, a portion of the connection terminal protruding from the end of the side wall toward the cover can be easily housed in the cover.

In the power conversion device in which the power line introduction hole extends along the predetermined inclination direction, the housing is preferably arranged adjacent to a motor case having a polygonal shape as viewed from a side and housing the motor and preferably has a width smaller than a maximum width of the motor case in a direction perpendicular to a direction in which the housing and the motor case are adjacent to each other as viewed from the side, and the power line introduction hole is preferably arranged in a vicinity of or adjacent to a portion of an outer wall of the motor case extending along the predetermined inclination direction as viewed from the side. Accordingly, the power line inserted into the power line introduction hole extends along the portion of the outer wall of the motor case, and thus a space between the power line and the portion of the outer wall can be reduced. Consequently, a space in which the power line is routed can be reduced.

In the power conversion device in which the power line introduction hole extends along the predetermined inclination direction, the connection terminal of the power converter is preferably arranged on an extension of the power line introduction hole extending along the predetermined inclination direction. Accordingly, the power line can be connected to the connection terminal without being bended, and thus a break in the power line can be more reliably reduced or prevented. Moreover, it is not necessary to bend the power line inside the housing, and thus the power line can be more easily connected to the connection terminal.

The power conversion device according to this aspect preferably further includes a power line introduction member fitted into the power line introduction hole and including an insertion hole into which the power line is inserted. Accordingly, the power line introduction member fitted into the power line introduction hole allows the power line to be introduced into the housing while reducing or preventing entry of water and dust into the housing.

In the power conversion device according to this aspect, the power converter preferably includes a film capacitor to smooth the power supplied from the power line, and the connection terminal is preferably provided on the film capacitor. Accordingly, the power line can be directly connected to the film capacitor. Consequently, it is not necessary to provide a bus bar or the like between the film capacitor and the power line, and thus the number of components can be reduced while an increase in the size of the power conversion device can be reduced or prevented.

In this case, the film capacitor preferably has a rectangular shape as viewed in a direction perpendicular to an arrangement surface of the housing on which the power converter is arranged, the power converter preferably includes a switch including a plurality of switching elements, and a connection conductor to connect the switch to the film capacitor, and the connection terminal is preferably provided on a side of the film capacitor different from a side of the film capacitor on which the connection conductor is provided, as viewed in the direction perpendicular to the arrangement surface. Accordingly, the length of one side of the film capacitor can be reduced as compared with a case in which the connection terminal and the connection conductor are provided on the same side of the film capacitor, and thus an increase in the size of the film capacitor can be reduced or prevented.

The power conversion device according to this aspect preferably further includes a cooling water inlet to introduce cooling water into the housing to cool the power converter, the housing preferably has a rectangular shape as viewed in a direction perpendicular to an arrangement surface of the housing on which the power converter is arranged, and the power line introduction hole is preferably provided on a side of the housing different from a side of the housing on which the cooling water inlet is provided, as viewed in the direction perpendicular to the arrangement surface. Accordingly, mutual interference between the cooling water inlet and the power line inserted into the power line introduction hole can be reduced or prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

The configuration of a power conversion device 100 according to this embodiment is now described with reference to FIGS. 1 to 9. In this description, one direction in a plane on which an arrangement surface 10a of a power converter 10 described below extends is defined as an X direction (an X1 direction and an X2 direction), a direction perpendicular to the X direction in the plane is defined as a Y direction (a Y1 direction and a Y2 direction), and a direction perpendicular to the arrangement surface 10a is defined as a Z direction (a Z1 direction and a Z2 direction). Configuration of Power Conversion Device The power conversion device 100 is attached to a motor 200 (see FIG. 7). The motor 200 is an in-vehicle motor, for example.

Figure 1:
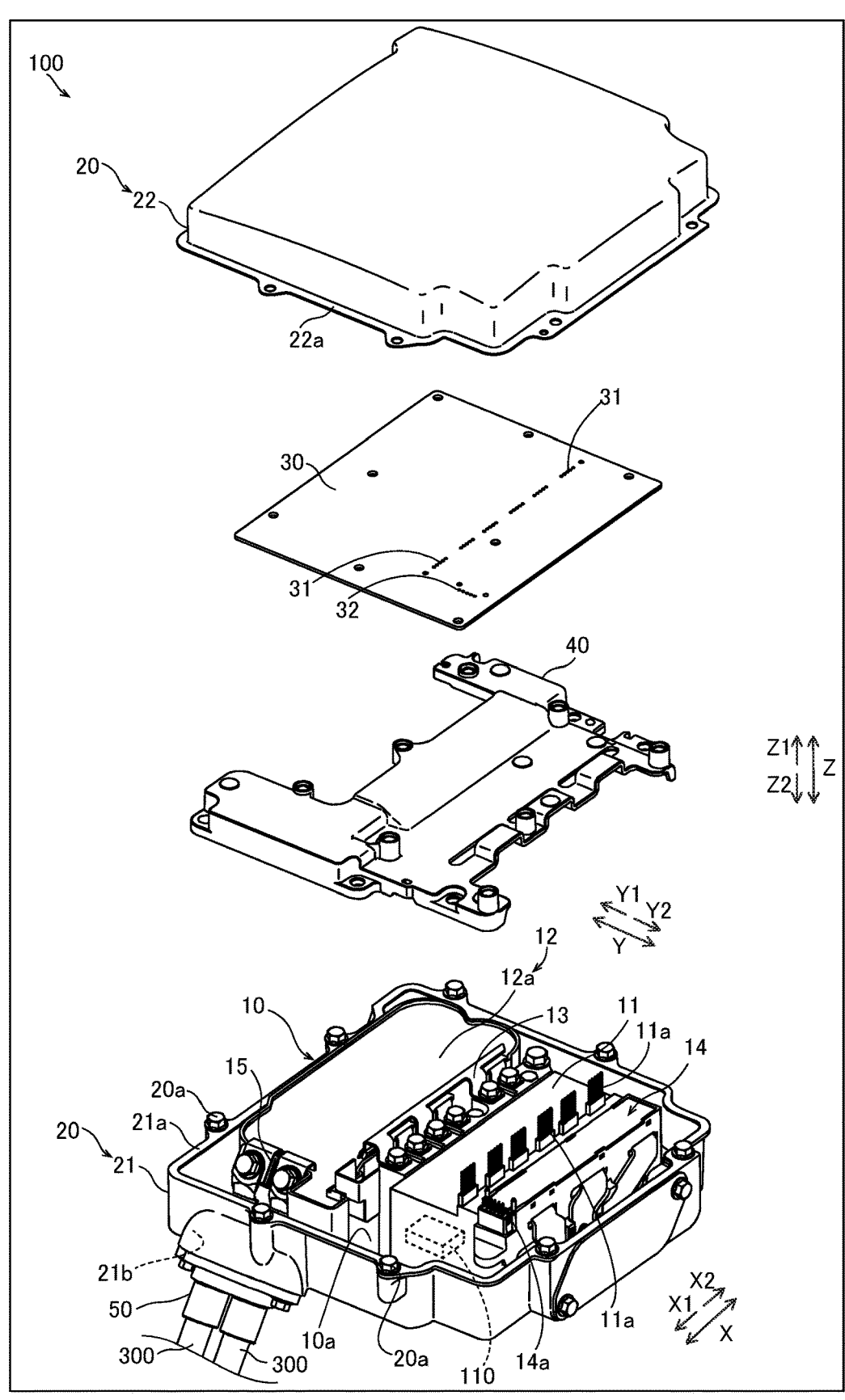
FIG. 1 is an exploded perspective view showing the configuration of a power conversion device according to an embodiment.

As shown in FIG. 1, the power conversion device 100 includes the power converter 10. The power converter 10 is an inverter. The power conversion device 100 also includes a housing 20 that houses the power converter 10. The housing 20 is attached to the motor 200 (see FIG. 7).

The housing 20 (a bottom 23 described below) has a rectangular shape (see FIG. 9) as viewed in a direction (Z direction) perpendicular to the arrangement surface 10a on which the power converter 10 is arranged. Specifically, as viewed in the Z direction, the housing 20 has a rectangular shape including a pair of sides extending along the X direction and a pair of sides (sides 20b and 20c described below; see FIG. 9) extending along the Y direction.

The power converter 10 includes a switch 11 including a plurality of switching elements 110. In FIG. 1, only one switching element 110 is shown for the sake of simplification. The power converter 10 also includes a film capacitor 12 that smooths power (DC power) supplied from a high-voltage battery (not shown) outside the power conversion device 100 via power lines 300. The film capacitor 12 is provided adjacent to the switch 11 on the Y1 side of the switch 11. The film capacitor 12 has a rectangular shape (see FIG. 8) as viewed in the Z direction. The film capacitor 12 includes a resin mold portion 12a having a pair of sides (sides 12b described below; see FIG. 8) extending along the X direction and a pair of sides (sides 12c described below; see FIG. 8) extending along the Y direction as viewed in the Z direction. A capacitor element (not shown) of the film capacitor 12 is molded into the resin mold portion 12a. The resin mold portion 12a is made of an insulating resin member. For example, the resin mold portion 12a is made of an epoxy resin.

The power converter 10 includes a connection conductor 13 that connects the switch 11 to the film capacitor 12. The connection conductor 13 is provided between the film capacitor 12 and the switch 11 aligned in the Y direction.

The power conversion device 100 also includes a current sensor 14 that detects a current flowing from the switch 11 to the motor 200. The current sensor 14 is provided on the Y2 side of the switch 11.

The housing 20 includes a side wall 21 that surrounds the power converter 10. The side wall 21 surrounds the power converter 10 as viewed in the Z direction. Specifically, the side wall 21 surrounds the switch 11, the film capacitor 12, the current sensor 14, etc. as viewed in the Z direction.

The housing 20 includes a cover 22 that covers the side wall 21. The cover 22 covers the side wall 21 from the Z1 direction side. The housing 20 also includes the bottom 23 (see FIG. 9) provided on the Z2 side of the side wall 21 and connected to the side wall 21. A portion of the housing 20 defined by the side wall 21 and the bottom 23 has a concave shape that is recessed toward the Z2 side.

The cover 22 is attachable to and detachable from the side wall 21. Specifically, the cover 22 is fixed to the side wall 21 by being fastened to the side wall 21 with a plurality of screws 20a. The power converter 10 is housed in the housing 20 while the cover 22 is fixed to the side wall 21.

The cover 22 is fixed to the side wall 21 while contacting an end 21a of the side wall 21 on the cover 22 side (Z1 side). Specifically, the cover 22 and the side wall 21 are screw-fastened to each other while an end 22a of the cover 22 on the side wall 21 side (Z2 side) and the end 21a of the side wall 21 contact each other.

The power conversion device 100 includes a control board 30 that controls the power converter 10. The control board 30 is connected to the switch 11 and the current sensor 14. The control board 30 controls the switch 11 based on a detected value received from the current sensor 14. The control board 30 covers the film capacitor 12, the switch 11, and the current sensor 14 from the Z1 side.

The control board 30 includes insertion holes 31 into which switch pins 11a of the switch 11 extending along the Z direction are inserted. The switch pins 11a are fixed (connected) to the control board 30 by being soldered to the insertion holes 31 while the switch pins 11a are inserted into the insertion holes 31. The control board 30 also includes insertion holes 32 into which current sensor pins 14a of the current sensor 14 extending along the Z direction are inserted. The current sensor pins 14a are fixed (connected) to the control board 30 by being soldered to the insertion holes 32 while the current sensor pins 14a are inserted into the insertion holes 32.

The power converter 10 includes a fixing plate 40 that fixes the control board 30. The fixing plate 40 is interposed between the control board 30 and the power converter 10. The fixing plate 40 covers a connection terminal 15 described below from the Z1 side. The fixing plate 40 is made of an insulating resin member. For example, the fixing plate 40 is made of PPS.

Figure 2:
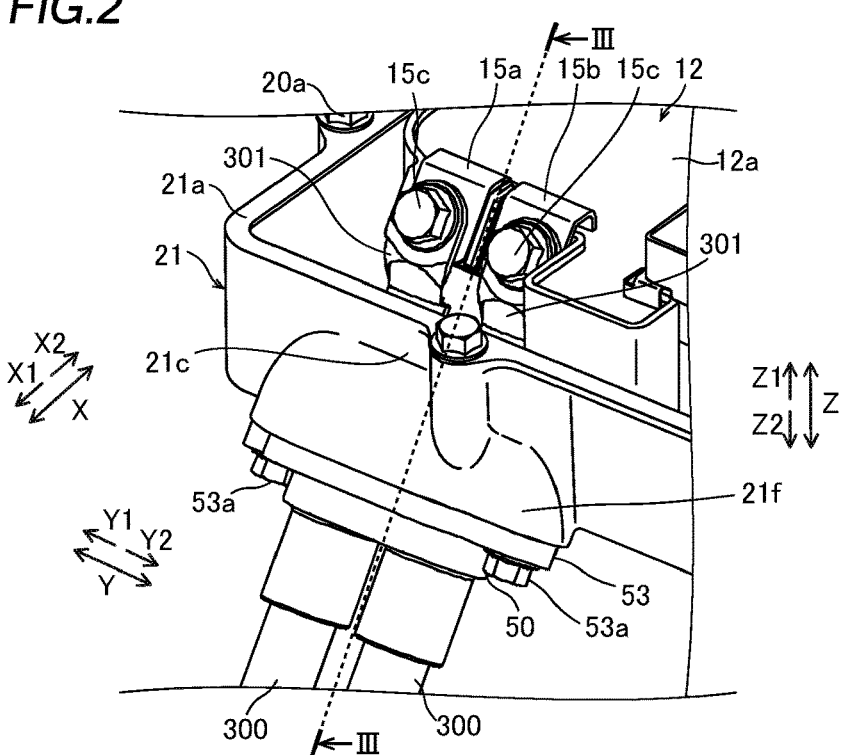
FIG. 2 is an enlarged view of the vicinity of a connection terminal in FIG. 1.
Figure 3:
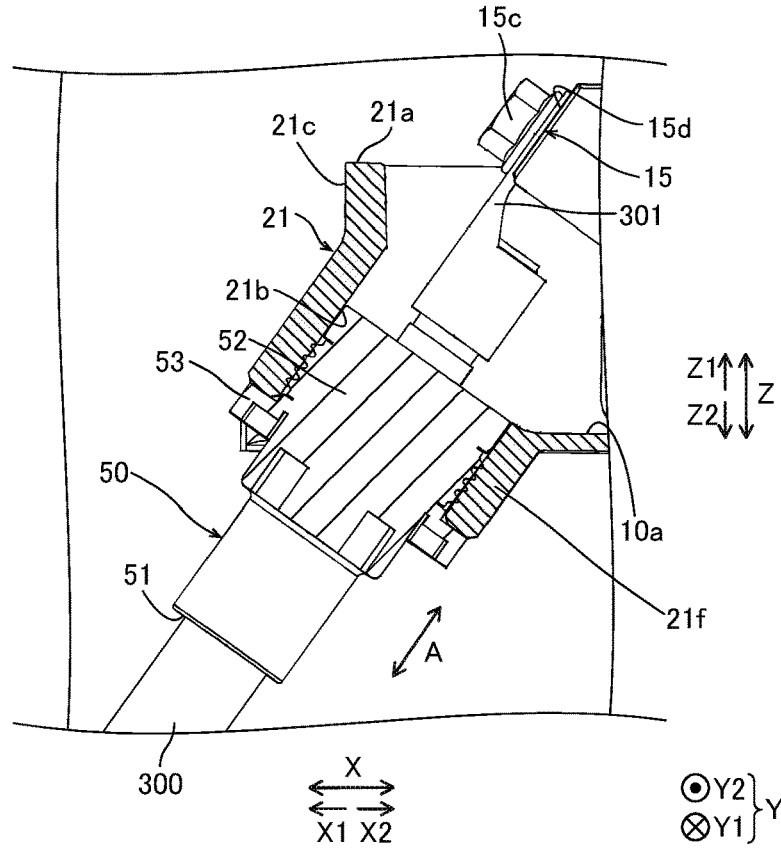
FIG. 3 is a sectional view taken along the line III-III in FIG. 2.

As shown in FIGS. 2 and 3, the housing 20 (side wall 21) includes a power line introduction hole 21b (see FIG. 3) through which the power lines 300 that supply power from the outside to the power converter 10 are introduced. That is, the power line introduction hole 21b is a through-hole provided in the side wall 21.

In this embodiment, the power converter 10 includes the connection terminal 15 to which terminals 301 of the power lines 300 introduced into the housing 20 through the power line introduction hole 21b are directly connected. Specifically, the connection terminal 15 is provided in the vicinity of or adjacent to a portion 21c of the side wall 21 in which the power line introduction hole 21b is provided. The connection terminal 15 faces the portion 21c of the side wall 21. The housing 20 (side wall 21) also includes a protrusion 21f provided on the portion 21c. The power line introduction hole 21b is provided inside the protrusion 21f. The protrusion 21f extends in an A direction described below.

As shown in FIG. 2, the connection terminal 15 includes a positive electrode terminal 15a and a negative electrode terminal 15b aligned along the Y direction. The positive electrode terminal 15a and the negative electrode terminal 15b are aligned along a direction in which the portion 21c of the side wall 21 extends.

The connection terminal 15 (15a, 15b) is fastened with screws 15c to the terminals 301 of the power lines 300, which are crimp terminals.

In this embodiment, the connection terminal 15 is provided on the film capacitor 12. Specifically, the connection terminal 15 protrudes from the resin mold portion 12a of the film capacitor 12. The connection terminal 15 is provided along the resin mold portion 12a of the film capacitor 12 by being bent in the vicinity of or adjacent to the resin mold portion 12a.

As shown in FIG. 3, the power line introduction hole 21b extends along the A direction inclined with respect to the Z direction perpendicular to the arrangement surface 10a. Specifically, the A direction is inclined toward the X2 side on the Z1 side. The A direction is an example of a "predetermined inclination direction" in the claims.

In this embodiment, the connection terminal 15 extends along the A direction inclined with respect to the Z direction perpendicular to the arrangement surface 10a. Specifically, a contact surface 15d of the connection terminal 15 that contacts the terminals 301 of the power lines 300 extends along the A direction. Thus, the power lines 300 inserted into the power line introduction hole 21b and the terminals 301 contacting the connection terminal 15 are fixed to the power conversion device 100 while extending along the A direction.

In this embodiment, the connection terminal 15 is arranged on an extension of the power line introduction hole 21b extending along the A direction. That is, the connection terminal 15 (contact surface 15d) extends along the extension of the power line introduction hole 21b.

Figures 4, 5:
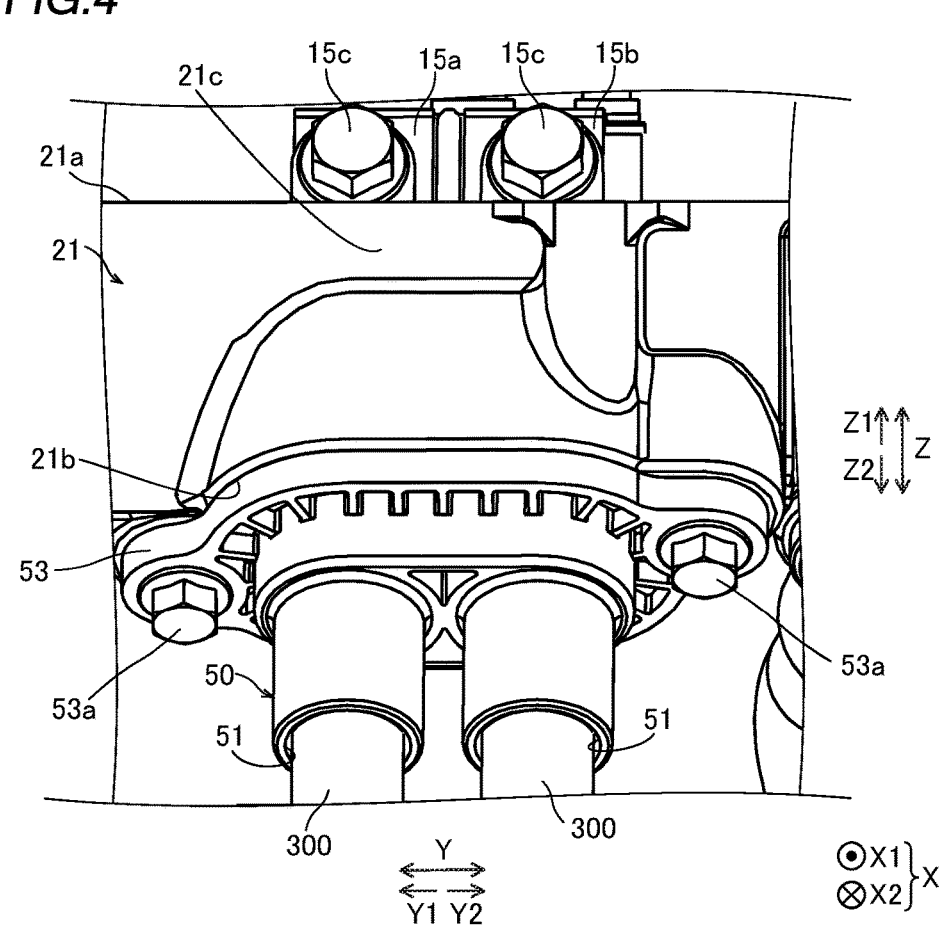
FIG. 4 is a diagram showing the connection terminal and a side wall according to the embodiment, as viewed from the front side.
FIG. 5 is a sectional view of a cover according to the embodiment.

In this embodiment, as shown in FIGS. 3 and 4, a portion of the connection terminal 15 of the power converter 10 extending along the A direction (see FIG. 3) inclined with respect to the Z direction perpendicular to the arrangement surface 10a protrudes from the end 21a of the side wall 21 connected to the cover 22 toward the cover 22 (Z1 side). Specifically, the connection terminal 15 protrudes from the end 21a to the Z1 side such that the entire screws 15c for fastening the connection terminal 15 and the terminals 301 of the power lines 300 are provided on the Z1 side with respect to the end 21a of the side wall 21.

In this embodiment, as shown in FIG. 5, the cover 22 has a concave shape that is recessed toward the side opposite to the side wall 21. Specifically, the cover 22 includes an outer peripheral wall 22b extending along the Z direction. The cover 22 also includes a ceiling surface 22c connected to the outer peripheral wall 22b and extending so as to intersect with the Z direction. The ceiling surface 22c has a convex curved shape toward the Z1 side.

In this embodiment, as shown in FIG. 3, the power conversion device 100 includes a grommet 50 that is fitted into the power line introduction hole 21b. The grommet 50 includes insertion holes 51 into which the power lines 300 are inserted. Two insertion holes 51 are provided so as to correspond to the power lines 300 for positive-side wiring and negative-side wiring, respectively. The grommet 50 also includes a fitted portion 52 that is fitted into the power line introduction hole 21*b*. The insertion holes 51 are arranged outside the power line introduction hole 21*b* in a state in which the fitted portion 52 is fitted into the power line introduction hole 21*b*. The grommet 50 is an example of a "power line introduction member" in the claims.

The grommet 50 is fitted into the power line introduction hole 21*b* while the power lines 300 for the positive-side wiring and the negative-side wiring are inserted into the insertion holes 51 of the grommet 50. Therefore, as compared with a case in which the positive-side power line 300 and the negative-side power line 300 are individually connected to the connection terminal 15, wrong (reverse) connections of the positive-side power line 300 and the negative-side power line 300 to the connection terminal 15 can be reduced or prevented.

Figure 6:
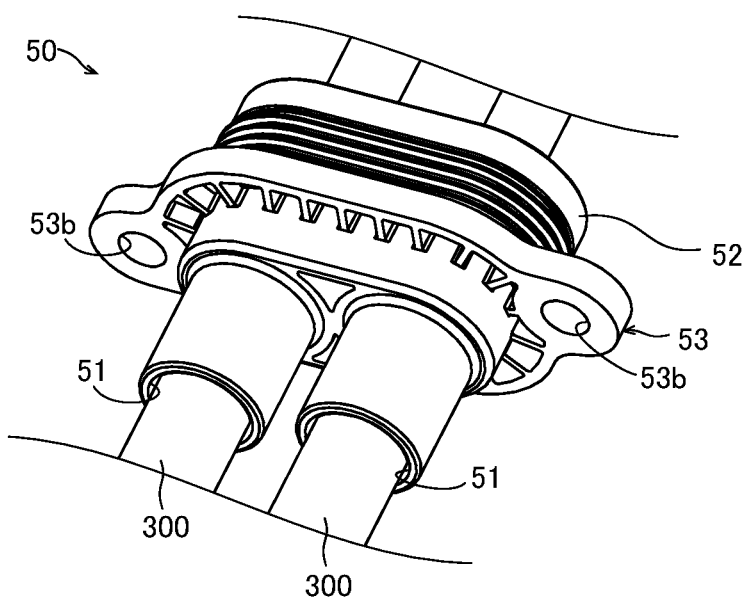
FIG. 6 is a perspective view showing the configuration of a grommet according to the embodiment.

As shown in FIG. 6, the grommet 50 includes a fastened portion 53 that is fastened to the housing 20. The fastened portion 53 includes screw holes 53*b* into which screws 53*a* (see FIG. 2) to be fastened to the housing 20 are inserted. The screw holes 53*b* are provided at a Y1-side end and a Y2-side end of the fastened portion 53, respectively.

The fastened portion 53 has a plate shape. The fastened portion 53 closes (seals) an opening of the power line introduction hole 21*b* on the side opposite to the power converter 10 when the fitted portion 52 is fitted into the power line introduction hole 21*b*.

Figure 7:
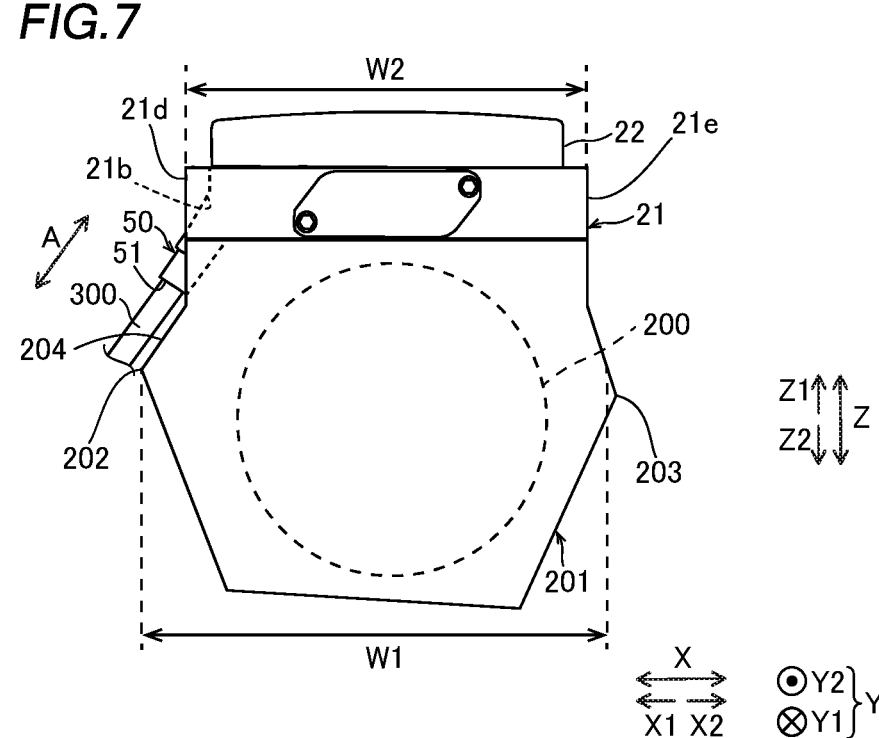
FIG. 7 is a diagram showing the power conversion device attached to a motor according to the embodiment, as viewed from the side.

As shown in FIG. 7, the housing 20 is arranged adjacent to a motor case 201 that houses the motor 200. Specifically, the motor case 201 and the housing 20 are provided adjacent to each other in the Z direction. The housing 20 is provided on the Z1 side of the motor case 201. The housing 20 is connected to the motor case 201. In other words, the housing 20 is fixed to motor case 201.

The motor case 201 has a polygonal shape as viewed from the side (as viewed from the Y2 direction side). The motor case 201 has a maximum width W1 in a direction (X direction) perpendicular to the direction (Z direction) in which the housing 20 and the motor case 201 are adjacent to each other, as viewed from the Y2 direction side. The housing 20 (side wall 21) has a width W2 in the X direction that is smaller than the maximum width W1 of the motor case 201. Specifically, as viewed from the side, a corner 202 of the motor case 201, which is an X1-side end, is provided on the X1 side with respect to an end 21*d* of the side wall 21 on the X1 side. Furthermore, as viewed from the Y2 direction side, a corner 203 of the motor case 201, which is an X2-side end, is provided on the X2 side with respect to an end 21*e* of the side wall 21 on the X2 side.

The motor case 201 includes a portion 204 of an outer wall extending along the A direction as viewed from the Y2 direction side. That is, the portion 204 of the outer wall extends parallel to the power line introduction hole 21*b*.

In this embodiment, the power line introduction hole 21*b* is arranged in the vicinity of or adjacent to the portion 204 of the outer wall of the motor case 201. Thus, the power lines 300 inserted into the power line introduction hole 21*b* are held so as to extend along the portion 204 of the outer wall of the motor case 201. The portion 204 of the outer wall is provided adjacent to the corner 202 on the Z1 side of the corner 202.

Figure 8:
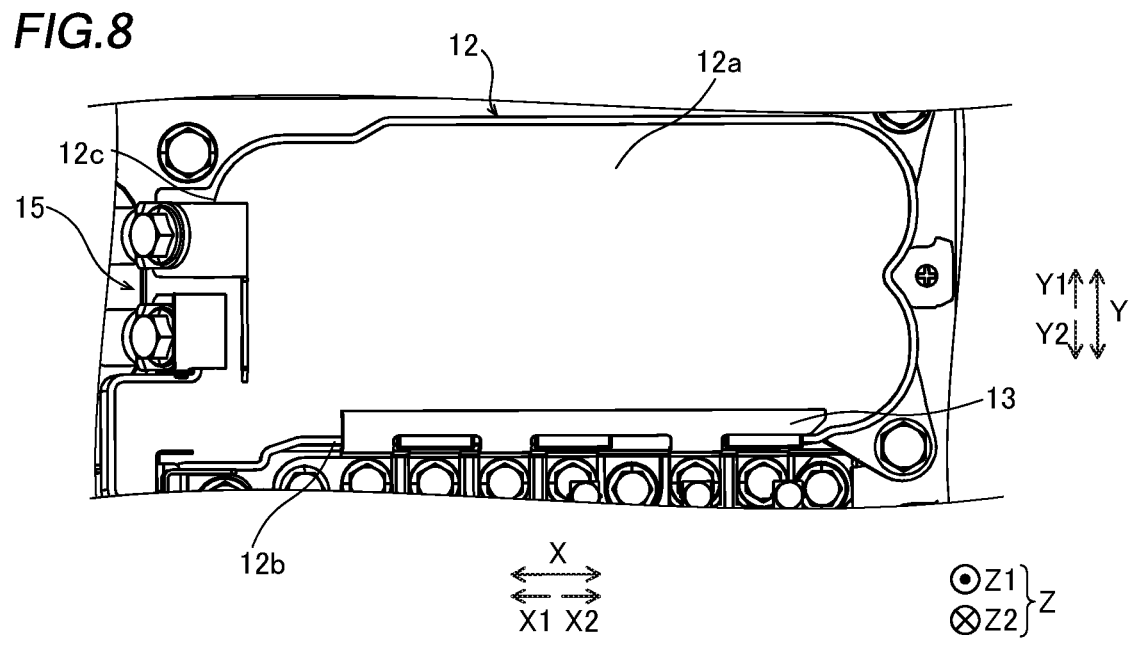
FIG. 8 is an enlarged plan view of the vicinity of a film capacitor according to the embodiment.

In this embodiment, as shown in FIG. 8, the connection terminal 15 is provided on the side 12*c* of the film capacitor

12 (resin mold portion 12*a*) different from the side 12*b* of the film capacitor 12 (resin mold portion 12*a*) on which the connection conductor 13 is provided, as viewed in the Z direction. Specifically, the connection conductor 13 is provided on the long side 12*b* of the film capacitor 12 (resin mold portion 12*a*) having a rectangular shape as viewed in the Z direction. The connection terminal 15 is provided on the short side 12*c* of the film capacitor 12 (resin mold portion 12*a*).

Figure 9:
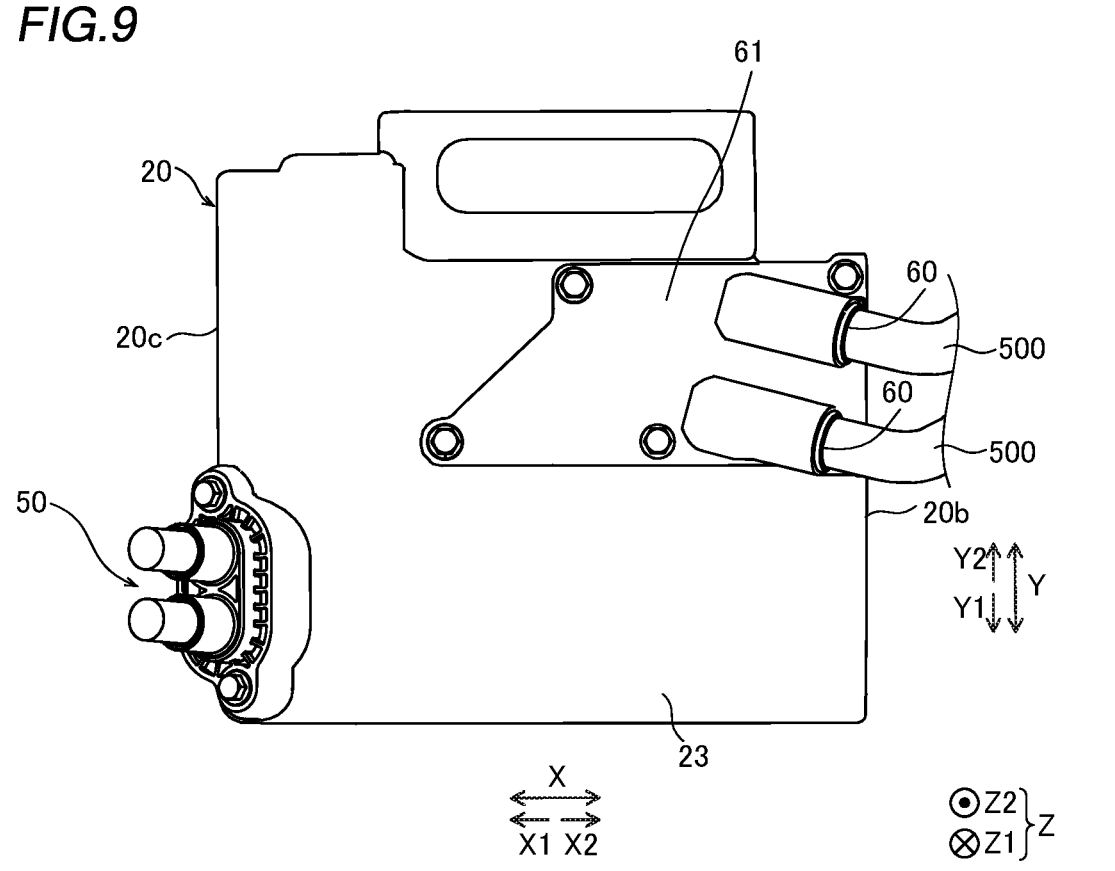
FIG. 9 is a diagram showing the power conversion device according to the embodiment, as viewed from the Z2 side.

As shown in FIG. 9, the power conversion device 100 includes cooling water inlets 60 that introduce cooling water for cooling the power converter 10 (switch 11) into the housing 20. On the Z2 side of the switch 11, flow passages (not shown) through which the cooling water introduced from the cooling water inlets 60 flows are provided. The cooling water inlets 60 are holes into which external cooling water pipes 500 are inserted.

Two cooling water inlets 60 are provided. Each of the two cooling water inlets 60 is provided on the side 20*b* of the rectangular housing 20, as viewed in the Z direction. Specifically, the cooling water inlets 60 are provided on a flow passage cover 61 that is attachable to and detachable from the bottom 23 of the housing 20. The cooling water inlets 60 extend from the flow passage cover 61 toward the X2 side, and are arranged in the vicinity of or adjacent to the side 20*b* of the housing 20 as viewed in the Z direction.

In this embodiment, the power line introduction hole 21*b* (see FIG. 2) is provided on the side 20*c* of the housing 20 different from the side 20*b* of the housing 20 on which the cooling water inlets 60 are provided, as viewed in the Z direction. Specifically, the power line introduction hole 21*b* is arranged on the side 20*c* of the rectangular housing 20 facing the side 20*b* as viewed in the Z direction. That is, the power line introduction hole 21*b* is provided on the side opposite to the cooling water inlets 60 with respect to the housing 20.

Advantageous Effects of this Embodiment

According to this embodiment, the following advantageous effects are achieved.

According to this embodiment, as described above, in the power conversion device 100, the housing 20 includes the power line introduction hole 21*b* through which the power lines 300 are introduced to supply power from the outside to the power converter 10, and the power converter 10 includes the connection terminal 15 to which the terminals 301 of the power lines 300 introduced into the housing 20 through the power line introduction hole 21*b* are directly connected. Accordingly, the power lines 300 can be directly connected to the power converter 10 via the connection terminal 15 provided inside the housing 20 without providing a connector to be connected to the power lines 300 on the outer peripheral surface of the housing 20. Consequently, it is not necessary to provide a connector, and thus an increase in the size of the power conversion device 100 can be reduced or prevented.

According to this embodiment, as described above, in the power conversion device 100, the power line introduction hole 21*b* extends along the A direction inclined with respect to the direction perpendicular to the arrangement surface 10*a* of the housing 20 on which the power converter 10 is arranged, and the connection terminal 15 of the power converter 10 extends along the A direction inclined with respect to the direction perpendicular to the arrangement surface 10*a*. Accordingly, the connection terminal 15 extends in the same direction as the direction in which the power line introduction hole 21*b* extends, and thus bending of the power lines 300 in the vicinity of the connection terminal 15 can be reduced or prevented. Consequently, a break in the power lines 300 can be reduced or prevented. Moreover, it is not necessary to bend the power lines 300 inside the housing 20, and thus the power lines 300 can be easily connected to the connection terminal 15.

According to this embodiment, as described above, in the power conversion device 100, at least a portion of the connection terminal 15 of the power converter 10 extending along the A direction inclined with respect to the direction perpendicular to the arrangement surface 10*a* of the housing 20 protrudes from the end 21*a* of the side wall 21 connected to the cover 22 toward the cover 22. Accordingly, when the cover 22 is detached from the side wall 21, at least a portion of the connection terminal 15 protrudes toward the cover 22, and thus the connection terminal 15 extending along the A direction can be easily screw-fastened, for example.

According to this embodiment, as described above, in the power conversion device 100, the cover 22 has a concave shape that is recessed toward the side opposite to the side wall 21. Accordingly, a portion of the connection terminal 15 protruding from the end 21*a* of the side wall 21 toward the cover 22 can be easily housed in the cover 22.

According to this embodiment, as described above, in the power conversion device 100, the power line introduction hole 21*b* is arranged in the vicinity of or adjacent to the portion 204 of the outer wall of the motor case 201 extending along the A direction as viewed from the side. Accordingly, the power lines 300 inserted into the power line introduction hole 21*b* extend along the portion 204 of the outer wall of the motor case 201, and thus a space between the power lines 300 and the portion 204 of the outer wall can be reduced. Consequently, a space in which the power lines 300 are routed can be reduced.

According to this embodiment, as described above, in the power conversion device 100, the connection terminal 15 of the power converter 10 is arranged on the extension of the power line introduction hole 21*b* extending along the A direction. Accordingly, the power lines 300 can be connected to the connection terminal 15 without being bended, and thus a break in the power lines 300 can be more reliably reduced or prevented. Moreover, it is not necessary to bend the power lines 300 inside the housing 20, and thus the power lines 300 can be more easily connected to the connection terminal 15.

According to this embodiment, as described above, the power conversion device 100 includes the grommet 50 fitted into the power line introduction hole 21*b* and including the insertion holes 51 into which the power lines 300 are inserted. Accordingly, the grommet 50 fitted into the power line introduction hole 21*b* allows the power lines 300 to be introduced into the housing 20 while reducing or preventing entry of water and dust into the housing 20.

According to this embodiment, as described above, in the power conversion device 100, the connection terminal 15 is provided on the film capacitor 12. Accordingly, the power lines 300 can be directly connected to the film capacitor 12. Consequently, it is not necessary to provide a bus bar or the like between the film capacitor 12 and the power lines 300, and thus the number of components can be reduced while an increase in the size of the power conversion device 100 can be reduced or prevented.

According to this embodiment, as described above, in the power conversion device 100, the connection terminal 15 is provided on the side 12*c* of the film capacitor 12 different from the side 12*b* of the film capacitor 12 on which the connection conductor 13 is provided, as viewed in the direction perpendicular to the arrangement surface 10*a*. Accordingly, the length of one side of the film capacitor 12 can be reduced as compared with a case in which the connection terminal 15 and the connection conductor 13 are provided on the same side of the film capacitor 12, and thus an increase in the size of the film capacitor 12 can be reduced or prevented.

According to this embodiment, as described above, in the power conversion device 100, the power line introduction hole 21*b* is provided on the side 20*c* of the housing 20 different from the side 20*b* of the housing 20 on which the cooling water inlets 60 are provided, as viewed in the direction perpendicular to the arrangement surface 10*a*. Accordingly, mutual interference between the cooling water inlets 60 and the power lines 300 inserted into the power line introduction hole 21*b* can be reduced or prevented.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the power line introduction hole 21*b* and the connection terminal 15 extend along the A direction (predetermined inclination direction) inclined with respect to the direction perpendicular to the arrangement surface 10*a* in the aforementioned embodiment, the present invention is not limited to this. For example, the power line introduction hole 21*b* and the connection terminal 15 may alternatively extend along the X direction. Furthermore, the power line introduction hole 21*b* and the connection terminal 15 may alternatively extend along the Z direction.

While at least a portion of the connection terminal 15 protrudes from the end 21*a* of the side wall 21 toward the cover 22 in the aforementioned embodiment, the present invention is not limited to this. For example, the connection terminal 15 may not protrude from the end 21*a* of the side wall 21 toward the cover 22.

While the power line introduction hole 21*b* is arranged in the vicinity of or adjacent to the portion 204 of the outer wall of the motor case 201 extending along the A direction (predetermined inclination direction) as viewed from the side in the aforementioned embodiment, the present invention is not limited to this. The portion of the outer wall of the motor case 201 in the vicinity of or adjacent to the power line introduction hole 21*b* may not extend along the A direction.

While the connection terminal 15 is arranged on the extension of the power line introduction hole 21*b* in the aforementioned embodiment, the present invention is not limited to this. The connection terminal 15 may not be arranged on the extension of the power line introduction hole 21*b*.

While the grommet 50 (power line introduction member) is fitted into the power line introduction hole 21*b* in the aforementioned embodiment, the present invention is not limited to this. The grommet 50 may not be fitted into the power line introduction hole 21*b*.

While the connection terminal 15 is provided on the film capacitor 12 in the aforementioned embodiment, the present invention is not limited to this. For example, the connection terminal 15 may alternatively be provided on a bus bar extending from the film capacitor 12.

While the connection terminal 15 is provided on the side 12c of the film capacitor 12 different from the side 12b of the film capacitor 12 on which the connection conductor 13 is provided, as viewed in the direction perpendicular to the arrangement surface 10a in the aforementioned embodiment, the present invention is not limited to this. The connection terminal 15 and the connection conductor 13 may alternatively be provided on the same side of the film capacitor 12.

While the power line introduction hole 21b is provided on the side 20c of the housing 20 different from the side 20b of the housing 20 on which the cooling water inlets 60 are provided, as viewed in the direction perpendicular to the arrangement surface 10a in the aforementioned embodiment, the present invention is not limited to this. The power line introduction hole 21b and the cooling water inlets 60 may alternatively be provided on the same side of the housing 20.

While the connection terminal 15 and the terminals 301 of the power lines 300 are connected to each other by screw fastening in the aforementioned embodiment, the present invention is not limited to this. The connection terminal 15 and the terminals 301 of the power lines 300 may alternatively be connected to each other by a method (welding, for example) other than screw fastening.

What is claimed is:

1. A power conversion device to be attached to a motor, the power conversion device comprising:
   a power converter; and
   a housing configured to be attached to the motor and housing the power converter; wherein
   the housing includes a power line introduction hole through which a power line is configured to be introduced to supply power from an outside to the power converter;
   the power converter includes a connection terminal to which a terminal of the power line introduced into the housing through the power line introduction hole is configured to be directly connected,
   the housing is located adjacent to a motor case that houses the motor, and
   the power line introduction hole is arranged adjacent to a wall of the motor case that extends in a direction in which the power line introduction hole extends.

2. The power conversion device according to claim 1, further comprising:
   a power line introduction member fitted into the power line introduction hole and including an insertion hole into which the power line is inserted.

3. The power conversion device according to claim 1, wherein
   the power converter includes a film capacitor configured to smooth the power supplied from the power line; and
   the connection terminal is provided on the film capacitor.

4. The power conversion device according to claim 1, further comprising:
   a cooling water inlet configured to introduce cooling water into the housing to cool the power converter; wherein
   the housing has a rectangular shape as viewed in a direction perpendicular to an arrangement surface of the housing on which the power converter is arranged; and
   the power line introduction hole is provided on a side of the housing different from a side of the housing on which the cooling water inlet is provided, as viewed in the direction perpendicular to the arrangement surface.

5. The power conversion device according to claim 1, wherein the wall of the motor case extends parallel to the power line introduction hole.

6. The power conversion device according to claim 1, wherein the motor case has a polygonal shape, and the wall of the motor case is an outer wall which is inclined with respect to a wall of the housing.

7. A power conversion device to be attached to a motor, the power conversion device comprising:
   a power converter; and
   a housing configured to be attached to the motor and housing the power converter; wherein
   the housing includes a power line introduction hole through which a power line is configured to be introduced to supply power from an outside to the power converter; and
   the power converter includes a connection terminal to which a terminal of the power line introduced into the housing through the power line introduction hole is configured to be directly connected,
   the power line introduction hole extends along a predetermined inclination direction inclined with respect to a direction perpendicular to an arrangement surface of the housing on which the power converter is arranged; and
   the connection terminal of the power converter extends along the predetermined inclination direction inclined with respect to the direction perpendicular to the arrangement surface.

8. The power conversion device according to claim 7, wherein
   the housing includes a side wall to surround the power converter, and a cover attachable to and detachable from the side wall to cover the side wall; and
   at least a portion of the connection terminal of the power converter extending along the predetermined inclination direction inclined with respect to the direction perpendicular to the arrangement surface of the housing protrudes from an end of the side wall connected to the cover toward the cover.

9. The power conversion device according to claim 8, wherein the cover has a concave shape that is recessed toward a side opposite to the side wall.

10. The power conversion device according to claim 7, wherein
   the housing is configured to be arranged adjacent to a motor case having a polygonal shape as viewed from a side and housing the motor, and has a width configured to be smaller than a maximum width of the motor case in a direction perpendicular to a direction in which the housing and the motor case are adjacent to each other as viewed from the side; and
   the power line introduction hole is configured to be arranged in a vicinity of or adjacent to a portion of an outer wall of the motor case extending along the predetermined inclination direction as viewed from the side.

11. The power conversion device according to claim 7, wherein the connection terminal of the power converter is arranged on an extension of the power line introduction hole extending along the predetermined inclination direction.

12. A power conversion device to be attached to a motor, the power conversion device comprising:
   a power converter; and a housing configured to be attached to the motor and
housing the power converter; wherein the housing includes a power line introduction hole
through which a power line is configured to be intro-
duced to supply power from an outside to the power
converter;

the power converter includes a connection terminal to
which a terminal of the power line introduced into the
housing through the power line introduction hole is
configured to be directly connected, the power converter includes a film capacitor configured
to smooth the power supplied from the power line;

the connection terminal is provided on the film capacitor, the film capacitor has a rectangular shape as viewed in a
direction perpendicular to an arrangement surface of
the housing on which the power converter is arranged;

the power converter includes a switch including a plural-
ity of switching elements, and a connection conductor
to connect the switch to the film capacitor; and the connection terminal is provided on a side of the film
capacitor different from a side of the film capacitor on
which the connection conductor is provided, as viewed
in the direction perpendicular to the arrangement sur-
face.

\* \* \* \* \*